(12) United States Patent
Shirur et al.

(10) Patent No.: US 7,729,185 B2
(45) Date of Patent: Jun. 1, 2010

(54) APPARATUS AND METHOD FOR DETECTION OF ADDRESS DECODER OPEN FAULTS

(75) Inventors: Rajshekhar Veeranna Shirur, Bljapur District (IN); Murugeswaran Surulivel, Thenl District (IN)

(73) Assignee: ARM Limited, Cambridge (GB)

( * ) Notice: Subject to any disclaimer, the term of this patent is extended or adjusted under 35 U.S.C. 154(b) by 254 days.

(21) Appl. No.: 12/000,600

(22) Filed: Dec. 14, 2007

(65) Prior Publication Data

US 2009/0116321 A1    May 7, 2009

(30) Foreign Application Priority Data

Nov. 1, 2007    (IN) .......................... 2283/DEL/2007

(51) Int. Cl.
G11C 7/00    (2006.01)
(52) U.S. Cl. .................. 365/201; 365/200; 365/230.06; 365/189.14
(58) Field of Classification Search .................. 365/201, 365/200, 230.06, 189.14, 189.12, 189.011
See application file for complete search history.

(56) References Cited

U.S. PATENT DOCUMENTS 6,400,621 B2 *    6/2002    Hidaka et al. ............... 365/200

* cited by examiner

Primary Examiner—David Lam
(74) Attorney, Agent, or Firm—Nixon & Vanderhye P.C.

(57) ABSTRACT

The apparatus comprises derived address generation circuitry, responsive to a base address portion of each base address, to generate an associated series of derived addresses. Each derived address is different from other derived addresses in that associated series and has a derived address portion that differs from the corresponding base address portion by a single address bit value. Read/write sequence generator circuitry is then responsive to each base address in turn, to write in said memory device a first data value at the base address and a second data value at each derived address in the associated series of derived addresses and is arranged to read a data value stored at the base address each time the second data value is written to one of the derived addresses, and to detect an address decoder open fault if the read data value is the second data value.

16 Claims, 8 Drawing Sheets

Ex: RF2ADV Combined decoder test (256x8M4): address 8; row 6, col 2;

| rowA[7:2] | col[1:0] | Calculation | Base address | W | Write address | R | Read address |
|---|---|---|---|---|---|---|---|
| 000000 | 00 | | 0 | W0 | 000000 00 | | |
| 000001 | 01 | Base⊕000001 | | W1 | 000001 01 | R0 | 000000 00 |
| 000010 | 10 | Base⊕000010 | | W1 | 000010 10 | R0 | 000000 00 |
| 000100 | 00 | Base⊕000100 | | W1 | 000100 00 | R0 | 000000 00 |
| 001000 | 00 | Base⊕001000 | | W1 | 001000 00 | R0 | 000000 00 |
| 010000 | 00 | Base⊕010000 | | W1 | 010000 00 | R0 | 000000 00 |
| 100000 | 00 | Base⊕100000 | | W1 | 100000 00 | R0 | 000000 00 |
| 000001 | 01 | | 1 | W0 | 000001 01 | R0 | 000000 00 |
| 000000 | 00 | Base⊕000001 | | W1 | 000000 00 | R0 | 000001 01 |
| 000011 | 11 | Base⊕000010 | | W1 | 000011 11 | R0 | 000001 01 |
| 000101 | 01 | Base⊕000100 | | W1 | 000101 01 | R0 | 000001 01 |
| 001001 | 01 | Base⊕001000 | | W1 | 001001 01 | R0 | 000001 01 |
| 010001 | 01 | Base⊕010000 | | W1 | 010001 01 | R0 | 000001 01 |
| 100001 | 01 | Base⊕100000 | | W1 | 100001 01 | R0 | 000001 01 |
| 000010 | 10 | | 2 | W0 | 000010 10 | R0 | 000001 01 |
| 000011 | 11 | Base⊕000001 | | W1 | 000011 11 | R0 | 000010 10 |
| 000000 | 00 | Base⊕000010 | | W1 | 000000 00 | R0 | 000010 10 |
| 000110 | 10 | Base⊕000100 | | W1 | 000110 10 | R0 | 000010 10 |
| 001010 | 10 | Base⊕001000 | | W1 | 001010 10 | R0 | 000010 10 |
| 010010 | 10 | Base⊕010000 | | W1 | 010010 10 | R0 | 000010 10 |
| 100010 | 10 | Base⊕100000 | | W1 | 100010 10 | R0 | 000010 10 |
| 000011 | 11 | | 3 | W0 | 000011 11 | R0 | 000010 10 |
| | | | | | | R0 | 000011 11 |
| | | | | | | | |
| 111110 | 10 | | 62 | W0 | 111110 10 | R0 | 111101 01 |
| 111111 | 11 | Base⊕000001 | | W1 | 111111 11 | R0 | 111110 10 |
| 111100 | 00 | Base⊕000010 | | W1 | 111100 00 | R0 | 111110 10 |
| 111010 | 10 | Base⊕000100 | | W1 | 111010 10 | R0 | 111110 10 |
| 110110 | 10 | Base⊕001000 | | W1 | 110110 10 | R0 | 111110 10 |
| 101110 | 10 | Base⊕010000 | | W1 | 101110 10 | R0 | 111110 10 |
| 011110 | 10 | Base⊕100000 | | W1 | 011110 10 | R0 | 111110 10 |
| 111111 | 11 | | 63 | W0 | 111111 11 | R0 | 111110 10 |
| 111110 | 10 | Base⊕000001 | | W1 | 111110 10 | R0 | 111111 11 |
| 111101 | 01 | Base⊕000010 | | W1 | 111101 01 | R0 | 111111 11 |
| 111011 | 11 | Base⊕000100 | | W1 | 111011 11 | R0 | 111111 11 |
| 110111 | 11 | Base⊕001000 | | W1 | 110111 11 | R0 | 111111 11 |
| 101111 | 11 | Base⊕010000 | | W1 | 101111 11 | R0 | 111111 11 |
| 011111 | 11 | Base⊕100000 | | W1 | 011111 11 | R0 | 111111 11 |
| | | | | | | R0 | 111111 11 |

Total pattern length: (words/mux_factor)*$\log_2$(words/mux_factor)+1
Ex: (256/4)* $\log_2$(256/4)+1 = 64*6+1 =385

FIGURE 7

Ex: RF1ADV Combined decoder test (256x8M4): address 8; row 6, col 2;

| R/W | rowA[7:2] | col[1:0] | Calculation | remarks |
|---|---|---|---|---|
| W0 | 000000 | 00 | | Base addr 0 |
| W1 | 000001 | 01 | Base⊕000001 | |
| R0 | 000000 | 00 | | |
| W1 | 000010 | 10 | Base⊕000010 | |
| R0 | 000000 | 00 | | |
| W1 | 000100 | 00 | Base⊕000100 | |
| R0 | 000000 | 00 | | |
| W1 | 001000 | 00 | Base⊕001000 | |
| R0 | 000000 | 00 | | |
| W1 | 010000 | 00 | Base⊕010000 | |
| R0 | 000000 | 00 | | |
| W1 | 100000 | 00 | Base⊕100000 | |
| R0 | 000000 | 00 | | |
| W0 | 000001 | 01 | | Base addr 1 |
| W1 | 000000 | 00 | Base⊕000001 | |
| R0 | 000001 | 01 | | |
| W1 | 000011 | 11 | Base⊕000010 | |
| R0 | 000001 | 01 | | |
| W1 | 000101 | 01 | Base⊕000100 | |
| R0 | 000001 | 01 | | |
| W1 | 001001 | 01 | Base⊕001000 | |
| R0 | 000001 | 01 | | |
| W1 | 010001 | 01 | Base⊕010000 | |
| R0 | 000001 | 01 | | |
| W1 | 100001 | 01 | Base⊕100000 | |
| R0 | 000001 | 01 | | |
| W0 | 000010 | 10 | | Base addr 2 |
| W1 | 000011 | 11 | Base⊕000001 | |
| R0 | 000010 | 10 | | |
| W1 | 000000 | 00 | Base⊕000010 | |
| R0 | 000010 | 0010 | | |
| W1 | 000110 | 10 | Base⊕000100 | |
| R0 | 000010 | 10 | | |
| W1 | 001010 | 10 | Base⊕001000 | |
| R0 | 000010 | 10 | | |
| W1 | 010010 | 10 | Base⊕010000 | |
| R0 | 000010 | 10 | | |
| W1 | 100010 | 10 | Base⊕100000 | |
| R0 | 000010 | 10 | | |

| R/W | rowA[7:2] | col[1:0] | Calculation | Remarks |
|---|---|---|---|---|
| W0 | 000011 | 11 | | Base addr 3 |
| W1 | 000010 | 10 | Base⊕000001 | |
| R0 | 000011 | 11 | | |
| W1 | 000001 | 01 | Base⊕000010 | |
| R0 | 000011 | 11 | | |
| W1 | 000111 | 11 | Base⊕000100 | |
| R0 | 000011 | 11 | | |
| W1 | 001011 | 11 | Base⊕001000 | |
| R0 | 000011 | 11 | | |
| W1 | 010011 | 11 | Base⊕010000 | |
| R0 | 000011 | 11 | | |
| W1 | 100011 | 11 | Base⊕100000 | |
| R0 | 000011 | 11 | | |
| | | | | Base addr 4 |
| | | | | Base addr 5 |
| | | | | Base addr 6 |
| | | | | Base addr 7 |
| | | | | |
| | | | | |
| | | | | |
| | | | | |
| | | | | |
| | | | | |
| | | | | |
| | | | | Base addr 62 |
| W0 | 111111 | 11 | | Base addr 63 |
| W1 | 111110 | 10 | Base⊕000001 | |
| R0 | 111111 | 11 | | |
| W1 | 111101 | 01 | Base⊕000010 | |
| R0 | 111111 | 11 | | |
| W1 | 111011 | 11 | Base⊕000100 | |
| R0 | 111111 | 11 | | |
| W1 | 110111 | 11 | Base⊕001000 | |
| R0 | 111111 | 11 | | |
| W1 | 101111 | 11 | Base⊕010000 | |
| R0 | 111111 | 11 | | |
| W1 | 011111 | 11 | Base⊕100000 | |
| R0 | 111111 | 11 | | |

Total pattern length: $2*(\text{words/mux\_factor})*\log_2(\text{words/mux\_factor}) + (\text{words/mux\_factor})$
Ex: $2*(256/4)*\log_2(256/4)+(256/4) = 2*64*6+64 = 768+64 = 832$

FIGURE 8

Ex: RA1ADV/RA2ADV combined row/column decoder test (4096x16M16): address 12; row 8, col 4;

| R/W | rowA[11:4] | col[3:0] | Calculation | remarks |
|---|---|---|---|---|
| W0 | 00000000 | 0000 | | Base addr 0 |
| W1 | 00000001 | 0001 | Base⊕00000001 | |
| R0 | 00000000 | 0000 | | |
| W1 | 00000010 | 0010 | Base⊕00000010 | |
| R0 | 00000000 | 0000 | | |
| W1 | 00000100 | 0100 | Base⊕00000100 | |
| R0 | 00000000 | 0000 | | |
| W1 | 00001000 | 1000 | Base⊕00001000 | |
| R0 | 00000000 | 0000 | | |
| W1 | 00010000 | 0000 | Base⊕00010000 | |
| R0 | 00000000 | 0000 | | |
| W1 | 00100000 | 0000 | Base⊕00100000 | |
| R0 | 00000000 | 0000 | | |
| W1 | 01000000 | 0000 | Base⊕01000000 | |
| R0 | 00000000 | 0000 | | |
| W1 | 10000000 | 0000 | Base⊕10000000 | |
| R0 | 00000000 | 0000 | | |
| W0 | 00000001 | 0001 | | Base addr 1 |
| W1 | 00000000 | 0000 | Base⊕00000001 | |
| R0 | 00000001 | 0001 | | |
| W1 | 00000011 | 0011 | Base⊕00000010 | |
| R0 | 00000001 | 0001 | | |
| W1 | 00000101 | 0101 | Base⊕00000100 | |
| R0 | 00000001 | 0001 | | |
| W1 | 00001001 | 1001 | Base⊕00001000 | |
| R0 | 00000001 | 0001 | | |
| W1 | 00010001 | 0001 | Base⊕00010000 | |
| R0 | 00000001 | 0001 | | |
| W1 | 00100001 | 0001 | Base⊕00100000 | |
| R0 | 00000001 | 0001 | | |
| W1 | 01000001 | 0001 | Base⊕01000000 | |
| R0 | 00000001 | 0001 | | |
| W1 | 10000001 | 0001 | Base⊕10000000 | |
| R0 | 00000001 | 0001 | | |
| W0 | 00000010 | 0010 | | Base addr 2 |
| W1 | 00000011 | 0011 | Base⊕00000001 | |
| R0 | 00000010 | 0010 | | |
| W1 | 00000000 | 0000 | Base⊕00000010 | |
| R0 | 00000010 | 0010 | | |
| W1 | 00000110 | 0110 | Base⊕00000100 | |
| R0 | 00000010 | 0010 | | |
| W1 | 00001010 | 1010 | Base⊕00001000 | |
| R0 | 00000010 | 0010 | | |
| W1 | 00010010 | 0010 | Base⊕00010000 | |
| R0 | 00000010 | 0010 | | |
| W1 | 00100010 | 0010 | Base⊕00100000 | |
| R0 | 00000010 | 0010 | | |
| W1 | 01000010 | 0010 | Base⊕01000000 | |
| R0 | 00000010 | 0010 | | |
| W1 | 10000010 | 0010 | Base⊕10000000 | |
| R0 | 00000010 | 0010 | | |

| R/W | rowA[11:4] | col[3:0] | Calculation | Remarks |
|---|---|---|---|---|
| W0 | 00000011 | 0011 | | Base addr 3 |
| W1 | 00000010 | 0010 | Base⊕00000001 | |
| R0 | 00000011 | 0011 | | |
| W1 | 00000001 | 0001 | Base⊕00000010 | |
| R0 | 00000011 | 0011 | | |
| W1 | 00000111 | 0111 | Base⊕00000100 | |
| R0 | 00000011 | 0011 | | |
| W1 | 00001011 | 1011 | Base⊕00001000 | |
| R0 | 00000011 | 0011 | | |
| W1 | 00010011 | 0011 | Base⊕00010000 | |
| R0 | 00000011 | 0011 | | |
| W1 | 00100011 | 0011 | Base⊕00100000 | |
| R0 | 00000011 | 0011 | | |
| W1 | 01000011 | 0011 | Base⊕01000000 | |
| R0 | 00000011 | 0011 | | |
| W1 | 10000011 | 0011 | Base⊕10000000 | |
| R0 | 00000011 | 0011 | | |
| | | | | Base addr 4 |
| | | | | Base addr 5 |
| | | | | Base addr 6 |
| | | | | Base addr 7 |
| | | | | . |
| | | | | . |
| | | | | . |
| | | | | . |
| | | | | . |
| | | | | . |
| | | | | . |
| | | | | . |
| | | | | . |
| | | | | Base addr 254 |
| W0 | 11111111 | 1111 | | Base addr 255 |
| W1 | 11111110 | 1110 | Base⊕00000001 | |
| R0 | 11111111 | 1111 | | |
| W1 | 11111101 | 1101 | Base⊕00000010 | |
| R0 | 11111111 | 1111 | | |
| W1 | 11111011 | 1011 | Base⊕00000100 | |
| R0 | 11111111 | 1111 | | |
| W1 | 11110111 | 0111 | Base⊕00001000 | |
| R0 | 11111111 | 1111 | | |
| W1 | 11101111 | 1111 | Base⊕00010000 | |
| R0 | 11111111 | 1111 | | |
| W1 | 11011111 | 1111 | Base⊕00100000 | |
| R0 | 11111111 | 1111 | | |
| W1 | 10111111 | 1111 | Base⊕01000000 | |
| R0 | 11111111 | 1111 | | |
| W1 | 01111111 | 1111 | Base⊕10000000 | |
| R0 | 11111111 | 1111 | | |

Total pattern length: $2*(words/mux\_factor)*\log_2(words/mux\_factor) + (words/mux\_factor)$
Ex: $2*(4096/16)* \log_2(4096/16)+(4096/16) = 2*256*8+256 = 4096+256=4352$
If it is mux 8: $2*512*9+512= 9728$; If it is mux 32: $2*128*7+128= 1920$

FIGURE 9

APPARATUS AND METHOD FOR DETECTION OF ADDRESS DECODER OPEN FAULTS

BACKGROUND OF THE INVENTION

1. Field of the Invention

The present invention relates to the testing of memory devices within data processing systems in order to detect memory defects, and more particularly relates to techniques for detection of address decoder open faults in such memory devices.

2. Description of the Prior Art

It is known to provide data processing system incorporating memories with self-testing mechanisms, sometimes termed built-in self-test (BIST) mechanisms, such that when the memory devices have been fabricated they may conduct a self-test or series of self-tests to determine if there are any memory defects present that would indicate that the circuit should be rejected. It is important that memory circuits should be highly reliable and that defective circuits should be effectively identified. As memory sizes increase, the proportion of the die being taken up by the memory is also increasing and, furthermore, the high transistor density within memory means that the defect density of these memories is becoming increasingly significant.

There are various types of defect that can arise in a memory device, and typically different tests need to be performed for each of the various types of defect. In addition to the detection of errors in the cells of the memory array itself, errors may also occur in the circuit elements used to control access to the memory cells within the memory array. For example, one or more address decoders may be provided in association with the memory array to activate particular rows and/or columns of the memory array dependent on an address provided to such address decoders. An address decoder can potentially suffer from an address decoder open fault (ADOF). ADOFs are caused by open defects in the logic gates of the memory address decoders, and due to their sequential behaviour, cannot be mapped to the faults of the memory array itself.

Considering for example a row address decoder used to activate a word line in the memory array, in fault free row address decoder circuitry only one word line is expected to be active at any point in time and hence during a write operation the data the subject of the write operation should only be written to the relevant location in that activated word line. However, if an open fault defect exists in one of the transistors of the address decoder, then a situation can arise where, when a new address is provided to the address decoder, a previously selected word line is not de-selected when the new word line appropriate to the new address is activated, and accordingly two word lines may be simultaneously activated. As a result, the data value the subject of the new write access request may end up being written to two locations.

Further details of address decoder open faults are provided in the article "Detection of CMOS Address Decoder Open Faults with March and Pseudo Random Memory Tests" by J Otterstedt et al., IEEE International Test Conference 1998, Pages 53 to 62. As described therein, a basic algorithm for testing for an open fault in an address decoder is to write a data value D to one address, and then to write the inverse data value $\overline{D}$ to a different address, after which the contents at the original address are read to determine if that data is D or $\overline{D}$. If the data at the original address is now $\overline{D}$, that indicates the presence of an open fault in the address decoder.

Clearly the above process needs to be repeated multiple times to seek to thoroughly test for all possible open faults within the address decoder. One mechanism that may be used is to perform a single step test, where each iteration of the above-mentioned algorithm (i.e. two writes followed by a read) is performed in response to a specified test command identifying the required addresses, data, etc. However, such an approach requires a very large amount of testing time to perform all of the required tests, and involves the issuance of multiple commands to identify each single step test. An additional problem is how to identify the appropriate addresses to write to in order to thoroughly test all possible open faults in the address decoder.

In the earlier-mentioned article "Detection of CMOS Address Decoder Open Faults with March and Pseudo Random Memory Tests", a more automated test procedure is described which uses linear feedback shift registers (LFSRs) to generate required address sequences. However, in accordance with the techniques described therein, different configurations of LFSRs are required dependent on the relative width of the address bits provided to the largest subaddress decoder to the overall address width (see cases 1 to 4 set out in section 4 of that paper). Indeed for the situation of case 4, namely where $k \geq (n+2)/2$ it is indicated that no LFSR-based solution could be found that would produce the required address sequences. In the above equation, k is the width of the largest subaddress decoder (i.e. the largest of the row decoder or the column decoder), and n is the overall address width.

Accordingly, it would be desirable to provide an improved technique for performing the required test sequence to detect address decoder open faults in a memory device.

SUMMARY OF THE INVENTION

Viewed from a first aspect, the present invention provides apparatus for performing a test sequence to detect address decoder open faults in a memory device, comprising: base address generation circuitry for generating a plurality of base addresses; derived address generation circuitry, responsive to a base address portion of each base address generated by the base address generation circuitry, to generate an associated series of derived addresses for that corresponding base address, each derived address being different to any other derived address in said associated series and having a derived address portion differing from the corresponding base address portion by a single address bit value; and read/write sequence generator circuitry, responsive to each base address in turn, to write in said memory device a first data value at that base address and a second data value at each derived address in said associated series of derived addresses for that base address, the read/write sequence generator circuitry being arranged to read a data value stored at the base address each time the second data value is written to one of said derived addresses in said associated series, and to detect an address decoder open fault if said read data value is said second data value.

In accordance with the present invention, base address generation circuitry is used to generate a plurality of base addresses, and derived address generation circuitry is arranged in response to a base address portion of each base address to generate an associated series of derived addresses. Each derived address is different to any other derived address in the associated series and has a derived address portion that differs from the corresponding base address portion by a single address bit value. Read/write sequence generator circuitry is then arranged to take each base address in turn, and to perform a sequence of write and read operations so that a first data value is written to the base address and a second data value is written to each derived address in the associated series of derived addresses. For each write operation to a derived address, a read operation is performed on the base address and if the second data value is detected at the base address, this indicates an address decoder open fault.

The base address portion used by the derived address generation circuitry may be the entire base address or some subset of the bits of the base address. For example, it may be appropriate to use the entire base address when the memory device has only a single address decoder (e.g. a row decoder when the memory device has only a single column). However, when the memory device has multiple decoders (e.g. a row decoder and a column decoder), it is possible in accordance with an embodiment of the present invention to use as the base address portion that portion of the address routed to one of the decoders, rather than the entire address.

In accordance with the present invention, the apparatus automatically generates the required sequence of addresses to enable detection of an address decoder open fault in any memory configuration, since the same basic hardware design can be used for any memory configuration, thereby providing a simple and efficient mechanism for thoroughly testing for address decoder open faults. Unlike the techniques described in the earlier-mentioned article, the mechanism of the present invention applies equally well for different ratios of subaddress decoder width to overall address width, and indeed operates for all ratios of subaddress decoder width to overall address width.

The derived address generation circuitry can take a variety of forms. However, in one embodiment, the derived address generation circuitry comprises a shift register comprising a plurality of bit positions for storing a derivation value, the derivation value being initialized to an initial derivation value; shift circuitry for altering the derivation value by performing a shift operation during which a first logical computation is performed using a bit value in a most significant bit position of the shift register and a bit value in another bit position of the shift register in order to produce a bit value to shift into a least significant bit position of the shift register; and derived address output circuitry for producing a derived address by performing a second logical computation using the base address portion and the derivation value, the derivation value being altered prior to generating each derived address in said associated series, and said associated series of derived addresses being complete when said derivation value returns to said initial derivation value. According to this embodiment, when the derivation value is altered by performing a shift operation, the bit value to shift into a least significant bit position of the shift register is determined by performing a first logical computation using not only the bit value in a most significant bit position but also a bit value in another bit position of the shift register.

In one embodiment, this first logical computation is a logical AND operation using as inputs the bit value in the most significant bit position and an inverted version of the bit value in said another bit position of the shift register. In one particular embodiment, said another bit position is a bit position adjacent the most significant bit position. In such embodiments, the shift register and associated shift circuitry operate as a non-linear feedback shift register.

As mentioned above, in one embodiment a derived address is produced by performing a second logical computation using the base address portion and the derivation value from the shift register. In one embodiment the most significant bit position of the shift register is not used when performing the second logical computation.

In one embodiment, the initial derivation value has a logic 1 value in the most significant bit position and logic 0 values in all other bit positions of the shift register. Hence, in embodiments where the most significant bit position of the shift register is not used when performing the second logical computation, it will be seen that the relevant portion of the initial derivation value comprises only logic zero values, and in one embodiment this has the effect that the base address portion is not altered by the initial derivation value. However, each time the derivation value is altered, a new derived address portion will be produced which differs from the base address portion by a single address bit value. Eventually, the derivation value will then return to the initial derivation value, at which point the associated series of derived addresses is deemed to be complete.

In one particular embodiment, when the initial derivation value is first modified, this causes a logic one value to be inserted into the least significant bit position, and thereafter each time the derivation value is changed, the single logic one bit value is propagated one bit position towards the most significant bit position, the derivation value returning to the initial derivation value when that single logic one bit value has been propagated all the way through the derivation value back to the most significant bit position.

It will be appreciated that the plurality of base addresses may be generated in a variety of ways. For example, in one embodiment all of the plurality of base addresses may be generated prior to the activities performed by the derived address generation circuitry, with one base address at a time then being referenced by the derived address generation circuitry. However, in an alternative embodiment, at any point in time the base address generation circuitry generates a single base address from said plurality of base addresses, the apparatus further comprising trigger circuitry which, each time the derivation value returns to said initial derivation value, issues a control signal to the base address generation circuitry to cause the base address generation circuitry to generate a different base address from said plurality of base addresses. This provides a simple and effective mechanism for triggering the base address generation circuitry to generate a new base address.

The plurality of base addresses can be determined in a variety of ways. However, in one embodiment the first base address corresponds to an initial address in the memory, and each time the trigger circuitry issues a control signal to the base address generation circuitry, the base address generation circuitry increments the base address having regard to the size of the column multiplexers (i.e. having regard to how many columns share a column multiplexer, typically referred to as the mux value). Hence, by way of example, if the mux value is 4, and hence there are four columns per column multiplexer, then the base address will typically be incremented by an increment value of four each time, with this process being repeated until the base address reaches a final valid address in memory having regard to the increment value. Alternatively the first base address may be chosen to be a final address in memory, and the base address generation circuitry is arranged to decrement the base address by a decrement value each time the control signal is received, until an initial valid address in memory is reached having regard to the decrement value.

In one embodiment, when all base addresses in said plurality of base addresses have been generated, the test sequence is finished when the derivation value next returns to said initial derivation value. By using the return of the derivation value to the initial derivation value to trigger the end of the test sequence, this provides a simple and effective mechanism for allowing the test sequence to be automatically terminated on completion.

As mentioned earlier, in one embodiment each derived address is produced by performing a second logical computation using the base address portion and the derivation value. In one embodiment, the second logical computation is a logical exclusive OR (XOR) operation where each bit of the base address portion is XORed with a corresponding bit of the derivation value. As a result, considering each bit of the base address portion, the value of that bit will pass unchanged into the derived address portion if the corresponding bit of the derivation value is a logic zero value, and will be inverted if the corresponding bit of the derivation value is a logic one value. Since in such embodiments only a single bit of the derivation value will be set to a logic one value at any point in time, this ensures that only a single bit of the derived address portion differs with respect to the base address portion.

In some embodiments, the memory device may comprise only a single address decoder. For example, each row of a memory may only comprise a single data value, i.e. there is only a single column in the memory array, and accordingly the memory device only requires a row decoder, and no column decoder. However, more generally, the memory device comprises a plurality of memory cells arranged in rows and columns, a first address portion of an address being used by row decoder circuitry in the memory device to identify an addressed row and a second address portion of an address being used by column decoder circuitry in the memory device to identify an addressed column. In such embodiments, open faults may be present in either the row decoder circuitry or the column decoder circuitry, and accordingly it would be desirable to perform a test sequence which detected open faults in either decoder.

In one embodiment, this is achieved using only a single block of derived address generation circuitry. In particular, in one such embodiment, the size of the shift register is dependent on the larger of the first address portion and the second address portion. In particular, in one such embodiment, the size of the shift register is one bit more than the number of bits in the larger of the first address portion and the second address portion. Hence, purely by way of example, if in an 8-bit address value, six bits are used to specify an addressed row and two bits are used to specify an addressed column, then the size of the shift register will be dictated by the six row address bits. In particular, in one embodiment when the most significant bit of the shift register is not used in the generation of the derived address from the base address, the shift register will comprise seven bits in the above-mentioned embodiment.

According to such embodiments, it is clear that the derived address generation circuitry can produce derived address portions for the larger of the two address portions. However, in one embodiment, the same derived address generation circuitry can also produce derived address portions for the other, smaller address portion. In particular, in one embodiment, when producing each derived address, the derived address output circuitry performs the second logical computation using the larger of the first address portion and the second address portion of the base address so as to produce as said derived address portion a corresponding larger address portion of the derived address, and then replicates a required number of least significant bits of said derived address portion to form a remaining address portion of the derived address. It has been found by such an approach that not only are derived address portions produced for the remaining address portion, but that by using derived addresses generated in such a manner, the test sequence can be applied to both the row decoder circuitry and the column decoder circuitry at the same time, thereby significantly reducing test time for testing both the row decoder and column decoder circuitry.

The choice of first data value and second data value can be varied dependent on embodiment. However, in one embodiment the second data value is an inverted version of the first data value. Hence, in such embodiments, each bit of the second data value is an inverted version of the corresponding bit of the first data value.

The techniques of embodiments of the present invention provide a simple and effective mechanism for automatically generating the required sequence of addresses in order to perform a test sequence to detect address decoder open faults in a memory device. There are a number of ways in which the apparatus can be instructed to perform the test sequence. However, in one embodiment the apparatus is responsive to a single test command from a test controller to perform the test sequence. Accordingly, in such embodiments a test controller can send a single command to the apparatus used to perform the test sequence, with the apparatus then being able to generate and apply the full test sequence without further instruction from the test controller. This hence significantly reduces the interaction between the test controller and the apparatus used to perform the test sequence.

Viewed from a second aspect, the present invention provides a method of performing a test sequence to detect address decoder open faults in a memory device, comprising: (a) generating a base address; (b) responsive to a base address portion of the base address, generating a series of derived addresses for the base address, each derived address being different to any other derived address in said series and having a derived address portion differing from the base address portion by a single address bit value; (c) writing in said memory device a first data value at the base address and a second data value at each derived address in said series of derived addresses; (d) reading a data value stored at the base address each time the second data value is written to one of said derived addresses in said series, and detecting an address decoder open fault if said read data value is said second data value; and (e) repeating steps (a) to (d) for each of a plurality of base addresses.

Viewed from a third aspect, the present invention provides an integrated circuit, comprising: a memory device comprising an array of memory cells and address decoder circuitry for accessing one or more selected memory cells in response to an address received by the address decoder circuitry; and memory test circuitry for performing a test sequence to detect address decoder open faults in the address decoder circuitry, the memory test circuitry comprising an apparatus according to the first aspect of the present invention.

In one embodiment, the integrated circuit further comprises a test controller for issuing test commands to the memory test circuitry to control operation of the memory test circuitry, the test controller issuing a single test command to cause said test sequence to be performed by the memory test circuitry.

BRIEF DESCRIPTION OF THE DRAWINGS

The present invention will be described further, by way of example only, with reference to embodiments thereof as illustrated in the accompanying drawings, in which:

FIGS. 7 to 9 are tables illustrating the address decoder open test patterns that are generated in accordance with embodiments of the present invention for three different types of memory.

DESCRIPTION OF EMBODIMENTS

Figure 1:
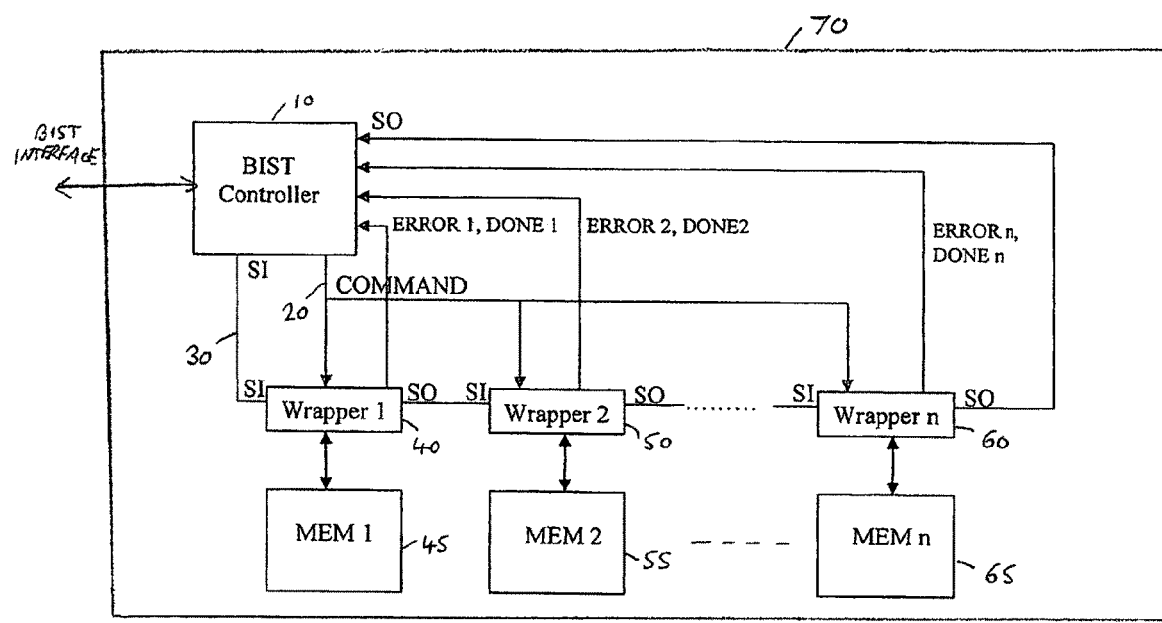
FIG. 1 is a block diagram of an integrated circuit in accordance with an embodiment of the present invention.

FIG. 1 is a block diagram of an integrated circuit in accordance with one embodiment of the present invention. The integrated circuit may take a variety of forms, but in one example may be a System-on-Chip (SoC). The integrated circuit 70 includes a number of memory units 45, 55, 65 which during normal operation of the integrated circuit are used to store instructions and/or data for reference by one or more processing devices provided on the integrated circuit. As such processing devices are not involved in the test procedures of embodiments of the present invention, they are omitted for clarity from FIG. 1.

The memory units 45, 55, 65 may take a variety of forms, but in one embodiment may include caches and/or other types of embedded memory, for example Tightly Coupled Memory (TCM), Random Access Memory (RAM), etc. Further, whilst each of the memory units 45, 55, 65 may be physically separate memory units, there is no requirement for them to be physically separate, and alternatively each of the memory units may represent logically distinct portions of memory. For the purposes of the illustration of FIG. 1, it will be assumed that each of the memory units 45, 55, 65 is of the same type of memory, and in accordance with one embodiment of the present invention these memory units are connected to a single BIST controller 10 via associated BIST wrapper units 40, 50, 60, respectively.

Whilst in FIG. 1 only three memories and associated BIST wrapper units are shown, the number of memories and associated BIST wrapper units can be varied as required, as indicated by the dotted lines between memory two 55 and memory n 65, and between wrapper two 50 and wrapper n 60.

Each of the BIST wrapper units 40, 50, 60 communicates with the controller 10 via a serial communication protocol. In particular, a scan chain 30 is provided to connect each test wrapper unit 40, 50, 60 in an ordered sequence with the test controller 10, and a further path 20 is provided for connecting each of the test wrapper units 40, 50, 60 directly with the test controller 10 to allow commands to be broadcast from the BIST controller 10 to the various test wrapper units.

The scan chain 30 is used to disseminate test data to the various test wrapper units, with this test data being routed sequentially through the first wrapper unit 40, the second wrapper unit 50, one or more subsequent wrapper units, and the final wrapper unit 60. Dependent on the mode of operation, selected registers within each wrapper unit will be connected between the serial in (SI) and serial out (SO) ports of each wrapper unit, and the controller 10 will output a sequence of bits for storing in those registers. Hence, as an example, the controller will output test data for the final wrapper 60 followed by test data for any intervening wrappers, followed by test data for wrapper 50, followed by test data for wrapper 40, with that data sequence being clocked sequentially through the sequence of wrappers, such that by the time the test data for the wrapper 60 has been clocked into the registers within that wrapper, the test data for wrapper 50 has likewise been clocked into the registers of the wrapper 50 and the test data for the wrapper 40 has been clocked into the registers of wrapper 40. Whilst this is going on the previous contents of those registers will also have been clocked out of the registers and returned via the SO port of the wrapper 60 back to the BIST controller 10.

By such an approach, the relevant registers within the test wrappers can be loaded with data defining a test to be performed, and then via the path 20 a start BIST command can be issued from the BIST controller 10 to each of the wrappers to cause those wrappers to begin the appropriate test sequence. Whilst a number of different tests may be supported by such an approach, in accordance with embodiments of the present invention one of the tests supported is an address decoder open fault test as will be discussed in more detail with reference to the remaining figures. Using the serial scan chain 30, the BIST controller can store in an instruction register within each wrapper a bit sequence identifying the address decoder open fault test, and can also store in other registers of the wrapper relevant parameters required for that test. As an example, the BIST controller can specify via the serial scan chain 30 a data value D to be written to a base address during the test sequence, and can specify whether the test should start with an initial base address and then increment base addresses, or should start with a final base address and decrement base addresses. The amount of the increment or decrement to be applied each time the base address changes will be dependent on the size of the mux value, i.e. the number of columns that are provided per column multiplexer. Further, each wrapper can typically determine an initial base address and a final base address based on the knowledge that wrapper has of the associated memory.

Hence, purely by way of example, if a memory has an initial address of 0, a final address of 255 and a mux value of 4, it will be appreciated that each sequence of four addresses will be accessed by the same row address. Hence by way of example addresses 0, 1, 2 and 3 are all accessed by a row address of 0, addresses 4, 5, 6 and 7 are all accessed by a row address of 1, and similarly the final row of addresses 252, 253, 254, 255 are all accessed by a row address of 63. In such a scenario, the base address for the test starts at 0, and is incremented each time by 4 until a final address of 252 is reached.

As also shown in FIG. 1, each BIST wrapper unit 40, 50, 60 is able to issue error and done signals back to the controller 10. In particular, when a particular BIST test sequence has been completed, each BIST wrapper unit can issue a done signal back to the controller to confirm that the test has completed. Further, if an error is detected whilst performing the test, an error signal can be returned from the relevant test wrapper unit to the controller 10. Accordingly, if whilst performing the address decoder open fault test, an open fault is detected, an error signal will be returned from the relevant wrapper unit to the BIST controller 10.

Figure 2:
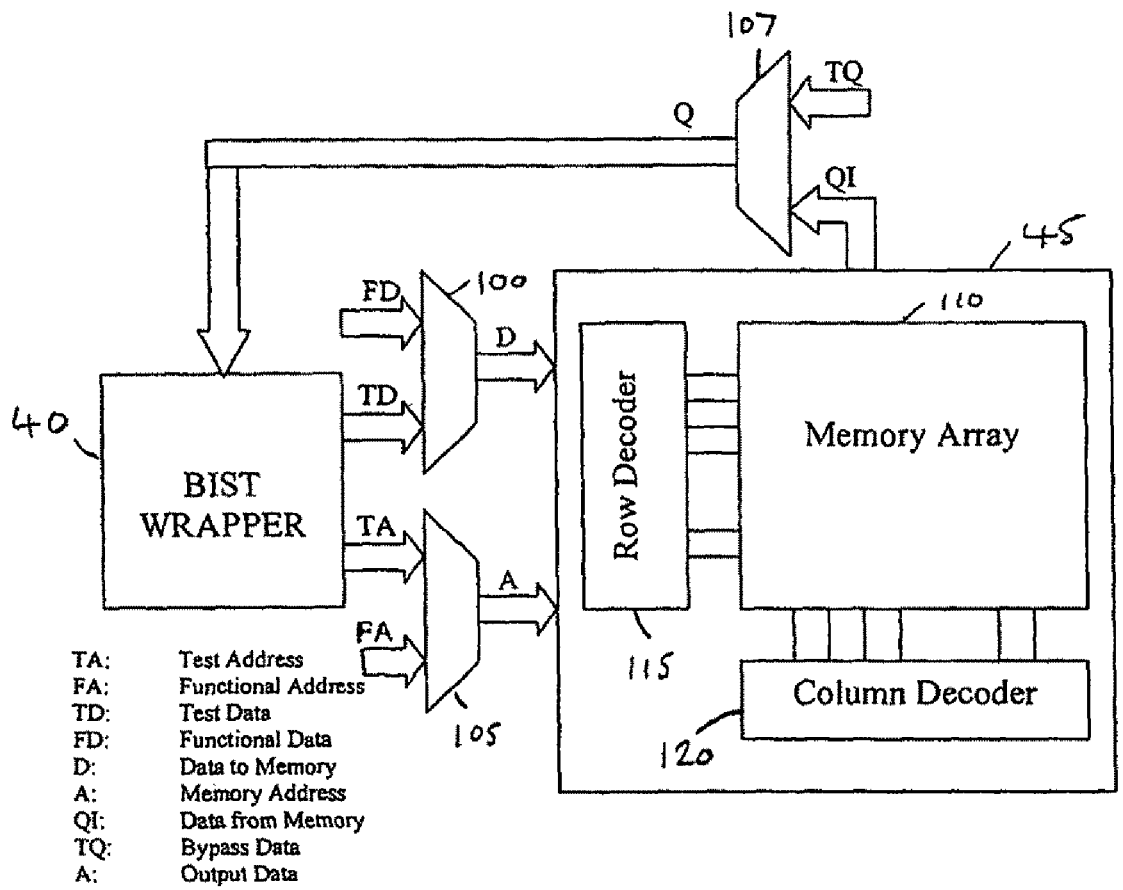
FIG. 2 is a block diagram illustrating in more detail the interface between a BIST wrapper and its associated memory in accordance with one embodiment of the present invention.

FIG. 2 illustrates the interface between each BIST wrapper and its associated memory. For the purposes of illustration, BIST wrapper 40 and memory 45 are illustrated, but the same interface will also be provided for the other wrapper units and their associated memories. During the BIST test mode of operation, the BIST wrapper 40 will generate a sequence of test addresses (TA) and associated test data (TD) and will control the multiplexers 100, 105 to route those test addresses and associated test data to the memory 45 instead of the normal functional addresses (FA) and functional data (FD) produced by the processing devices that would use the memory units during a normal mode of operation. Data from the memory (QI) can be routed back to the BIST wrapper 40 via multiplexer 107. Bypass data (TQ) can also be routed via multiplexer 107 back to the BIST wrapper 40 if performing a test seeking to observe a fault at the output port rather than a fault within the memory. During a normal mode of operation, the multiplexers 100, 105 will be controlled so as to route the functional addresses and functional data between the relevant processing devices and the memory units.

Figure 3:
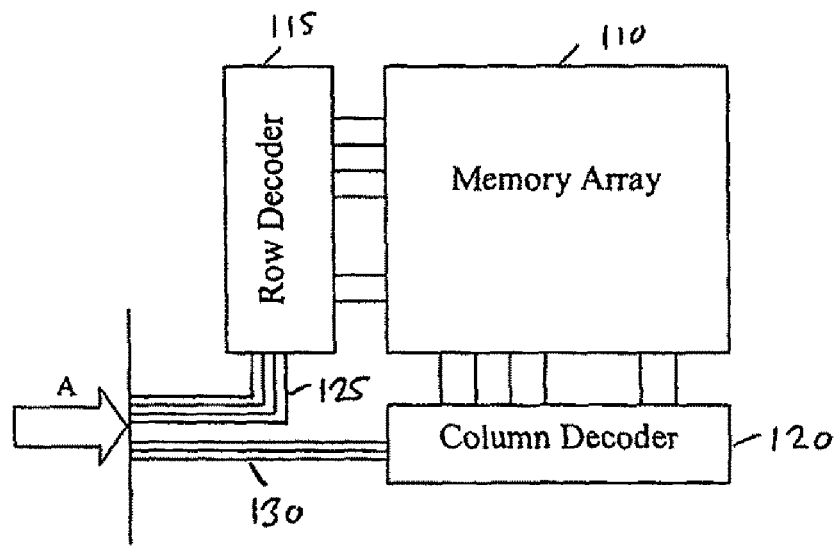
FIG. 3 illustrates how the bits of the address are routed to the row decoder and column decoder of FIG. 2.

As shown in FIG. 2, each memory unit will typically consist of a memory array 110 consisting of a plurality of rows and columns of memory cells, and the memory array will be accessed by row decoder circuitry 115 and column decoder circuitry 120. As shown schematically in FIG. 3 any address provided from the multiplexer 105 will consist of a first address portion routed over path 125 and used by the row decoder 115 to identify a particular row within the memory array, and a second address portion routed over path 130 and used by the column decoder 120 to identify a particular column within the memory array. It will be appreciated that in some embodiments, where only a single accessible data value is stored in each row, there is no requirement for a column decoder 120, since only a single column is considered to exist within the memory array. In that case, all of the address bits are used as row address bits passed to the row decoder 115. However, in the general case, there will typically be a plurality of columns in the memory array, with the first portion of the address being used by the row decoder to identify a particular word line and to activate that word line, and with the second portion of the address being used by the column decoder 120 to identify a particular column in the memory array, and to then access the data value in that column at the selected word line using the bit lines connected to the relevant memory cells in that word line.

Figure 4:
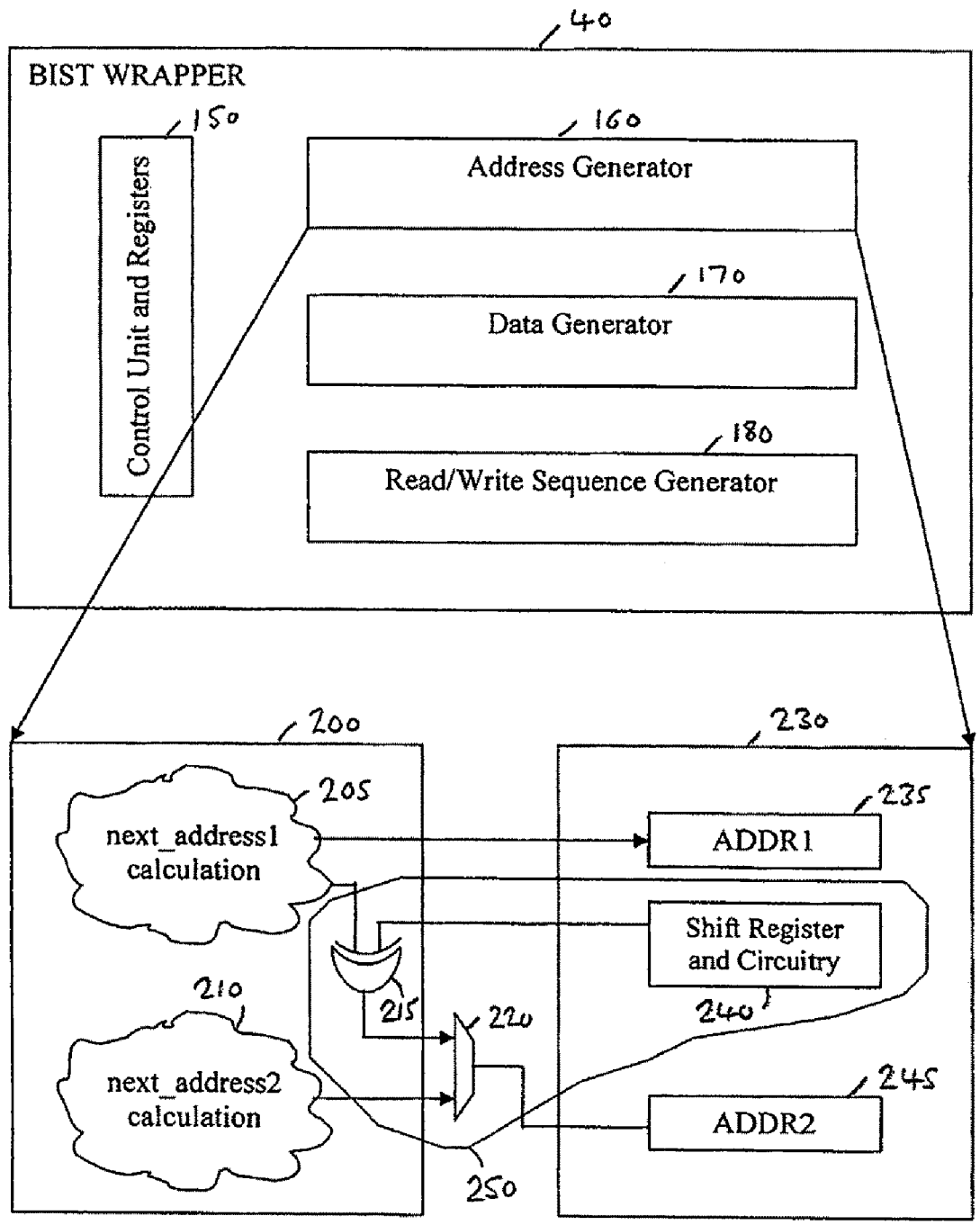
FIG. 4 is a diagram illustrating in more detail the components provided within the BIST wrapper in accordance with one embodiment of the present invention.

As will now be discussed with reference to FIGS. 4 to 6, in accordance with one embodiment of the present invention, the BIST wrapper unit is provided with some additional circuitry, referred to herein as derived address generation circuitry, for generating, for each of a number of identified base addresses, an associated series of derived addresses. Each derived address is different from any other derived address in the associated series and has a derived address portion that differs from the corresponding base address portion by a single address bit value. FIG. 4 schematically illustrates various components provided within the BIST wrapper circuitry 40. The basic components of the BIST wrapper 40 are address generator circuitry 160, data generator circuitry 170, a read/write sequence generator 180 and control unit and registers 150. As shown in FIG. 4, the address generator circuitry 160 consists of combinatorial logic 200 and registers 230 used for storing certain address information. The next address calculation blocks 205, 210 and associated address registers 235, 245, respectively, may exist within a standard address generator circuitry of a typical BIST wrapper 40 for generating addresses for a variety of test operations.

In accordance with embodiments of the present invention, the address generator circuitry 160 is supplemented by the additional pieces of circuitry encircled by the line 250 in FIG. 4. When performing an address decoder open fault test sequence, the next address calculation block 205 is used to generate each required base address. Each time a base address is calculated, it is stored in the address register 235, and is also routed as an input to the XOR circuitry 215. The XOR circuitry 215 also receives an output from the shift register and shift circuitry 240, this output specifying a derivation value used in combination with a portion of the base address by XOR circuitry 215 to produce a derived address which is then output to the multiplexer 220. In the address decoder open fault mode of operation, the multiplexer 220 is arranged to route the output from the XOR circuitry 215 to the second address register 245 instead of using the address register 245 to store addresses that would in other modes of operation be generated by the next address calculation block 210.

During each clock cycle following the generation of a new base address, the shift register and associated shift circuitry 240 alters the derivation value thereby resulting in the production of a new derived address for storing in the address register 245. This continues until the derivation value returns to an initial derivation value, at which point all of the derived addresses in the associated series have been determined, and the next address calculation block 205 is triggered to generate the next base address for storing in the address register 235. Thereafter, the process of generating the series of derived addresses is repeated, and this process continues for each base address until all of the base addresses and associated series of derived addresses have been produced.

Whilst the above process is being performed by the address generator, the read/write sequence generator 180 is arranged to perform a sequence of write and read operations. In particular, an initial write operation is performed to the base address stored in the address register 235, the data generator 170 providing a data value D for storing at that base address. Following this write operation, further write operations are performed to each of the derived addresses stored in the address register 245, in this instance the data generator 170 producing the inverted data value $\overline{D}$, with $\overline{D}$ then being written to each derived address. In association with each write operation to a derived address, a read operation is also performed to the base address in order to determine whether the data value stored at the base address is D or $\overline{D}$. If the address decoder circuitry is operating correctly, the data value should be D, but if the data value read from the base address at some point becomes $\overline{D}$, this is indicative of a address decoder open fault.

Figure 5:
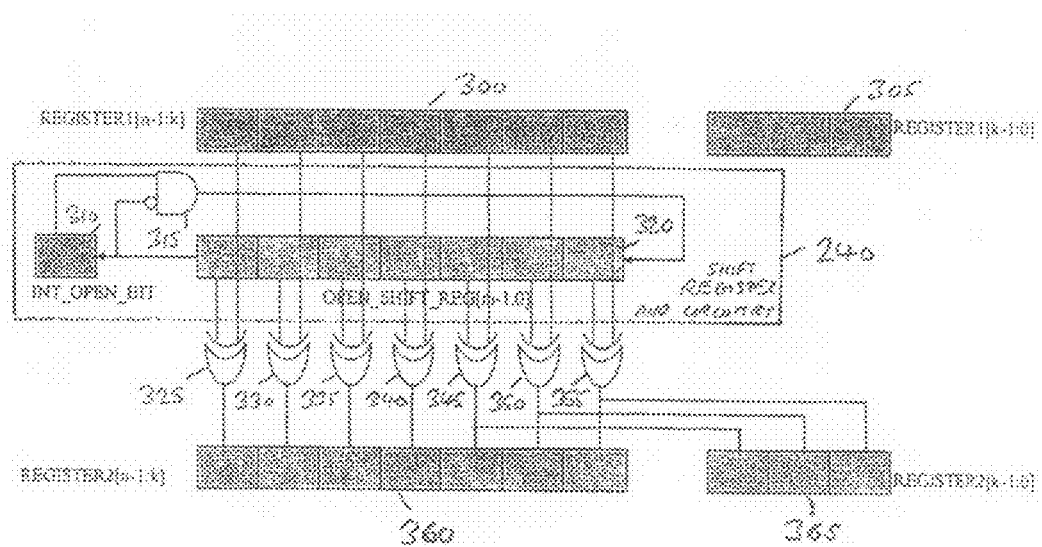
FIG. 5 is a diagram illustrating in more detail how the shift register and associated shift circuitry is used to generate derived addresses from a base address in accordance with one embodiment of the present invention.

FIG. 5 illustrates in more detail the generation of derived addresses using the shift register and associated circuitry 240 and the XOR circuitry 215 of FIG. 4. The shift register itself consists of a structure 320 referred to as the open shift register and an additional bit 310 referred to as the int_open_bit, the int_open_bit forming the most significant bit of the shift register. The size of the open shift register 320 is dependent on the larger of the row address portion and column address portion of the address. As shown schematically in FIG. 5, if the base address stored in address register 235 is n bits in length, then bits n–1 to k constitute the row address and bits k–1 to 0 constitute the column address. In this example, the row address portion 300 is larger than the column address portion 305, and the open shift register 320 has a bit for each bit of the row address portion 300. However, it will be appreciated that the same structure can also be used if the column address portion is larger than the row address portion, in which case the bits 300 can be considered to be the column address portion and the bits 305 can be considered to be the row address portion. For the purposes of the following description, it will be assumed that the row address portion is the larger address portion.

An initial derivation value is stored within the shift register, in the embodiment illustrated in FIG. 5 this initial derivation value consisting of a logic one value as the int_open_bit 310, and logic zero values in each bit position of the open shift register 320. The XOR structure 215 of FIG. 4 is actually formed by separate XOR gates 325, 330, 335, 340, 345, 350, 355, one XOR gate being provided for each bit position in the row address portion. Each XOR gate hence receives the associated bit from the row address portion and the corresponding bit from the open shift register, and produces an output bit forming the associated bit in the derived address portion 360. When the open shift register contains all logic zero values, it will be appreciated that the XOR gates cause no modification of the row address portion of the base address, and accordingly the output row address portion 360 is the same as the input base address portion 300.

As also shown in FIG. 5, the relevant output column address portion 365 is derived directly from the corresponding least significant bits of the output row address portion rather than being based in any way on the input column address portion 305. This has been found to provide an effective mechanism for testing for open faults in both the row decoder 115 and the column decoder 120 simultaneously, whilst enabling the overall size of the additional circuitry added to the address generator 160 to be dictated solely by the larger of the row address portion and the column address portion. This reduces the hardware overhead by only needing to use the larger of the row address portion and the column address portion to generate the required derived addresses, and the ability to effectively test both the row decoder and the column decoder in parallel significantly improves the speed at which the open fault decoder tests can be performed.

Starting with the initial derivation value, it can be seen that when a shift operation is applied to alter the derivation value, a logic one value will be output from the AND gate 315, due to the presence of a logic one bit in the int_open_bit 310 and a logic zero bit in the uppermost bit of the open shift register 320. This will hence cause a logic one value to be inserted into the least significant bit of the open shift register 320, and for the remaining bits of the open shift register and the bit in the int_open_bit 310 to be at a logic zero level. This hence causes the XOR gate 355 to invert the value of the associated bit in the row address portion 300 when producing the derived row address portion 360, with all other bits being unchanged. When the derivation value is next altered, the logic one bit value is shifted one bit to the left in the open shift register 320, but the AND gate 315 now outputs a logic zero value, and accordingly the least significantly bit of the open shift register 320 becomes a logic zero value. Accordingly, it can be seen that the XOR gate 350 now inverts the associated bit of the row address portion 300 to produce the derived row address portion 360, with all other bits of the derived address portion 360 being the same as the input base row address portion 300. This process repeats for each derived address, such that each derived row address portion 360 differs by only one bit from the associated base row address portion.

In all instances, the derived column address portion is formed from the relevant bits of the derived row address portion (or vice versa if it is the column address portion that is larger than the row address portion).

When the injected logic one value has rippled all the way through the open shift register and passes back to the int_open_bit 310, then it can be seen that the derivation value returns to the initial derivation value, at which point a signal is issued to the next address calculation block 205 to cause a new base address to be generated. If at this point all of the required base addresses have been generated, then the test sequence ends.

Figure 6:
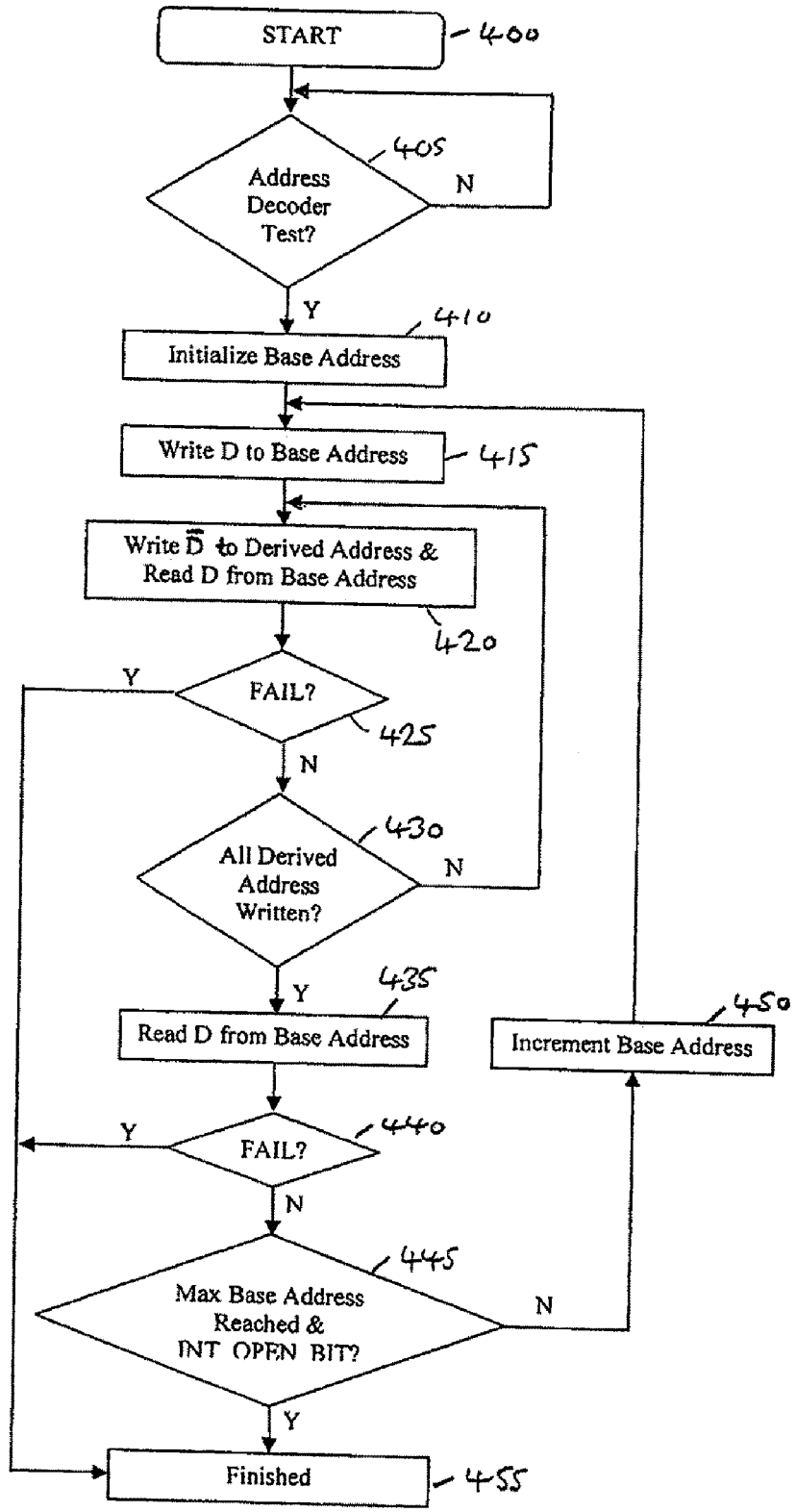
FIG. 6 is a flow diagram illustrating the steps performed by BIST wrapper circuitry when performing an address decoder open fault test in accordance with one embodiment of the present invention.

FIG. 6 illustrates the steps performed by the BIST wrapper circuitry to perform the address decoder open fault test sequence in accordance with one embodiment of the present invention. At step 400, the process starts, whereafter at step 405 it is determined whether the required test is an address decoder open fault test. When an address decoder open fault test is indicated from the BIST controller, then at step 410 the base address is initialized, whereafter at step 415 the data value D is written to that base address by the read/write sequence generator 180.

Thereafter, at step 420, the inverted data value $\overline{D}$ is written to the first derived address, and the data value is D is read from the base address. For a dual ported memory such as will be discussed with reference to FIG. 7, the write and read operations at step 420 can be performed in parallel, whilst for single ported memory as will be discussed by way of illustration with reference to FIGS. 8 and 9, the read operation in step 420 will follow in a clock cycle after the write operation.

Once the data value has been read from the base address, it is determined at step 425 whether that data value is in fact the data value D as expected, or instead is the data value $\overline{D}$. In the event that it is the data value $\overline{D}$, a fail condition is detected, i.e. an open fault is detected, and the process proceeds to step 455 where a done and an error signal are issued from the wrapper unit back to the BIST controller.

However, if a fail condition is not identified, then at step 430 it is determined whether all derived addresses in the series have had the data value $\overline{D}$ written to them. If not, the process returns to step 420. However, assuming all derived addresses have had the data value $\overline{D}$ written to them, then the process proceeds to step 435, where the data value is again read from the base address. This final read step is required in order to determine whether the final write operation to a derived address corrupted the base address data value due to a open fault. Accordingly, at step 440, the same check is performed as at step 425, and if an open fault is detected, the process finishes at step 455.

If no fault is detected, the process proceeds to step 445, where it is determined whether the maximum base address has been reached and the int_open_bit 310 is set. The int_open_bit 310 is only set when the derivation value is at the initial derivation value and accordingly if the int_open_bit is set and the maximum base address has been reached, this indicates that the test sequence is complete, and accordingly the process finishes at step 455.

If however it is determined that the condition at step 445 is not met, then the process proceeds to step 450, where the base address is incremented, and the process then returns to step 415 where the data value D is written to the new base address, and the above-described steps are then repeated.

In accordance with embodiments of the present invention, it will be appreciated that once the relevant test data has been loaded into the wrapper units 40, 50, 60, the entire test sequence for detecting an address decoder open fault in both the row decoder and the column decoder can be initiated via a single BIST command issued over path 20 from the BIST controller 10 to the wrapper units, thereby significantly simplifying the process of performing address decoder open faults. Further, the required sequence of addresses are generated automatically within each wrapper unit, and both the row decoder and the column decoder are tested in parallel, thereby leading to a very efficient technique for performing open fault detection.

The additional hardware required to support such address decoder open fault tests can be kept to a minimum, since the registers used to store the base address and the derived address can typically be provided by pre-existing registers within the BIST wrapper unit. Further, the size of the shift register and associated shift circuitry, along with the associated XOR functionality, is dictated solely by the larger of the row address portion and column address portion of the address, rather than being dictated by the entire address width, leading to a significant reduction in additional hardware.

FIGS. 7 to 9 are tables illustrating example address decoder open test patterns for three particular types of memory. In the example of FIG. 7, the memory is a dual ported memory having a size of "256×8", i.e. 256 words, where each word is 8 bits in length. Since there are 256 words, this requires 8 address bits to identify each word. In this example the mux value "M" is 4, meaning that there are four columns for each column multiplexer in the memory array. Hence, two bits of the address are used to identify the column and six bits of the address are used to specify the row. As shown in FIG. 7, each write operation to a derived address and associated read operation from the base address can be performed in parallel using the dual ported memory. As shown by the equation at the bottom of FIG. 7, the total number of clock cycles required to perform the test sequence is 385 cycles. Another way of determining this pattern length for a dual ported memory is by the equation $n \times 2^n + 1$ cycles, where n is the width of the larger address portion, in this example six.

Hence, as another example, if a dual ported memory has no column decoder and uses four bits to specify its addresses, then it will take 65 cycles to test the decoder using the technique of embodiments of the present invention. It is also worth noting that if instead the memory did have a number of columns, and accordingly had associated row decoder and column decoder circuitry, and by way of example seven bits were used for each address, four bits of which were specifying the row address and three bits specifying the column address, it would still only take 65 cycles to test both the row and column decoders, since the column decoder is tested concurrently with the row decoder using the sequence generated for the row decoder, instead of requiring generating a sequence separately for the column decoder.

FIG. 8 shows an example test sequence for the same type of memory as in FIG. 7, but where that memory is single ported rather than dual ported, and accordingly the write operation to a derived address and associated read operation from a base address have to occur in separate clock cycles. As shown by the equation at the bottom of FIG. 8, the total number of cycles to perform the test in this case is 832.

FIG. 9 shows another example of single ported memory, where there are 4096 words in the memory, each word being 16 bits in length. Since there are 4096 words, this requires 12 address bits. The mux value is given as 16, meaning that there are 16 columns per column multiplexer, hence requiring four column address bits out of the total 12 address bits. As shown from the equation at the bottom of FIG. 9, the total number of cycles to perform this test is 4352. Similarly, if the mux factor was 8 instead of 16, it would take 9728 cycles, and if the mux factor was 32 instead of 16 it would take 1920 cycles.

From the above description of embodiments of the present invention, it will be seen that such embodiments provide a particularly simple and effective mechanism for performing open fault detection tests in respect of address decoders provided in a memory device. Only a small amount of additional hardware is required, the test sequence can be implemented in response to a single command from the BIST controller, and both the row decoder and the column decoder can be tested in parallel using the sequence of addresses produced within the test wrapper.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. Apparatus for performing a test sequence to detect address decoder open faults in a memory device, comprising:
   base address generation circuitry for generating a plurality of base addresses;
   derived address generation circuitry, responsive to a base address portion of each base address generated by the base address generation circuitry, to generate an associated series of derived addresses for that corresponding base address, each derived address being different to any other derived address in said associated series and having a derived address portion differing from the corresponding base address portion by a single address bit value; and
   read/write sequence generator circuitry, responsive to each base address in turn, to write in said memory device a first data value at that base address and a second data value at each derived address in said associated series of derived addresses for that base address, the read/write sequence generator circuitry being arranged to read a data value stored at the base address each time the second data value is written to one of said derived addresses in said associated series, and to detect an address decoder open fault if said read data value is said second data value.

2. Apparatus as claimed in claim 1, wherein said derived address generation circuitry comprises:
   a shift register comprising a plurality of bit positions for storing a derivation value, the derivation value being initialized to an initial derivation value;
   shift circuitry for altering the derivation value by performing a shift operation during which a first logical computation is performed using a bit value in a most significant bit position of the shift register and a bit value in another bit position of the shift register in order to produce a bit value to shift into a least significant bit position of the shift register; and
   derived address output circuitry for producing a derived address by performing a second logical computation using the base address portion and the derivation value, the derivation value being altered prior to generating each derived address in said associated series, and said associated series of derived addresses being complete when said derivation value returns to said initial derivation value.

3. Apparatus as claimed in claim 2, wherein the most significant bit position of the shift register is not used when performing the second logical computation.

4. Apparatus as claimed in claim 2, wherein said initial derivation value has a logic 1 value in the most significant bit position and logic 0 values in all other bit positions of the shift register.

5. Apparatus as claimed in claim 2, wherein at any point in time the base address generation circuitry generates a single base address from said plurality of base addresses, the apparatus further comprising trigger circuitry which, each time the derivation value returns to said initial derivation value, issues a control signal to the base address generation circuitry to cause the base address generation circuitry to generate a different base address from said plurality of base addresses.

6. Apparatus as claimed in claim 5, wherein when all base addresses in said plurality of base addresses have been generated, the test sequence is finished when the derivation value next returns to said initial derivation value.

7. Apparatus as claimed in claim 2, wherein the first logical computation is a logical AND operation using as inputs the bit value in the most significant bit position and an inverted version of the bit value in said another bit position of the shift register.

8. Apparatus as claimed in claim 7, wherein said another bit position is a bit position adjacent the most significant bit position.

9. Apparatus as claimed in claim 2, wherein said second logical computation is a logical exclusive OR (XOR) operation where each bit of the base address portion is XORed with a corresponding bit of the derivation value.

10. Apparatus as claimed in claim 2, wherein the memory device comprises a plurality of memory cells arranged in rows and columns, a first address portion of an address being used by row decoder circuitry in the memory device to identify an addressed row and a second address portion of an address being used by column decoder circuitry in the memory device to identify an addressed column, the size of the shift register being dependent on the larger of the first address portion and the second address portion, and the larger of the first address portion and the second address portion being used as said base address portion.

11. Apparatus as claimed in claim 10, wherein when producing each derived address, the derived address output circuitry performs the second logical computation using the larger of the first address portion and the second address portion of the base address so as to produce as said derived address portion a corresponding larger address portion of the derived address, and then replicates a required number of least significant bits of said derived address portion to form a remaining address portion of the derived address.

12. Apparatus as claimed in claim 1, wherein said second data value is an inverted version of the first data value.

13. Apparatus as claimed in claim 1, wherein the apparatus is responsive to a single test command from a test controller to perform the test sequence.

14. An integrated circuit, comprising:
a memory device comprising an array of memory cells and address decoder circuitry for accessing one or more selected memory cells in response to an address received by the address decoder circuitry; and
memory test circuitry for performing a test sequence to detect address decoder open faults in the address decoder circuitry, the memory test circuitry comprising an apparatus as claimed in claim 1.

15. An integrated circuit as claimed in claim 14, further comprising a test controller for issuing test commands to the memory test circuitry to control operation of the memory test circuitry, the test controller issuing a single test command to cause said test sequence to be performed by the memory test circuitry.

16. A method of performing a test sequence to detect address decoder open faults in a memory device, comprising:
(a) generating a base address;
(b) responsive to a base address portion of the base address, generating a series of derived addresses for the base address, each derived address being different to any other derived address in said series and having a derived address portion differing from the base address portion by a single address bit value;
(c) writing in said memory device a first data value at the base address and a second data value at each derived address in said series of derived addresses;
(d) reading a data value stored at the base address each time the second data value is written to one of said derived addresses in said series, and detecting an address decoder open fault if said read data value is said second data value; and
(e) repeating steps (a) to (d) for each of a plurality of base addresses.

* * * * *